United States Patent [19]

Kanno et al.

[11] Patent Number: 4,791,238
[45] Date of Patent: Dec. 13, 1988

[54] HIGH-DENSITY WIRED CIRCUIT BOARD USING INSULATED WIRES

[75] Inventors: Masao Kanno, Shimodate; Naoki Fukutomi, Yuki; Yorio Iwasaki, Shimodate; Fujio Kojima, Shimodate; Hidehiro Nakamura, Shimodate, all of Japan

[73] Assignee: Hitachi Chemical Company, Ltd., Tokyo, Japan

[21] Appl. No.: 32,247

[22] Filed: Mar. 31, 1987

[30] Foreign Application Priority Data

Mar. 31, 1986 [JP] Japan .................................. 61-73833

[51] Int. Cl.4 .......................... H05K 1/00; H05K 3/00
[52] U.S. Cl. ..................................... 174/68.5; 29/831; 361/416
[58] Field of Search ....................... 174/68.5; 361/416; 29/829, 831

[56] References Cited

U.S. PATENT DOCUMENTS

| | | | |
|---|---|---|---|
| 3,674,602 | 7/1972 | Keogh et al. | 156/380 |
| 3,674,914 | 7/1972 | Burr | 174/68.5 |
| 3,895,181 | 7/1975 | La Grange et al. | 174/68.5 |
| 3,969,816 | 7/1976 | Swengel, Sr. et al. | 174/68.5 X |
| 4,298,770 | 11/1981 | Nishihara et al. | 174/68.5 |
| 4,554,405 | 11/1985 | Varker | 174/68.5 |

Primary Examiner—Morris H. Nimmo
Attorney, Agent, or Firm—Antonelli, Terry & Wands

[57] ABSTRACT

A high-density wired circuit board obtained by providing an auxiliary grid at the position of centroid of a main grid and by employing wiring in the inclined direction mainly instead of wiring in the XY directions mainly can make the space between wires and through-holes large without narrowing a wiring pitch.

20 Claims, 6 Drawing Sheets

HIGH-DENSITY WIRED CIRCUIT BOARD USING INSULATED WIRES

BACKGROUND OF THE INVENTION

This invention relates to a high-density wired circuit board having a required wiring pattern by using insulated wires.

Printed circuit boards are mainly produced by a subtractive process wherein a wiring pattern is formed by using a copper-clad laminate and dissolving and removing unnecessary portions by chemicals. On the other hand, there also exists an additive process wherein a wiring pattern is formed by electroless plating on a laminate having no copper foil thereon. According to these processes, since the wiring is formed on a plane, crossed wiring cannot be formed on the same plane. The crossed wiring is obtained by using different planes, perforating through-holes therethrough, and metallizing inner walls of the through-holes by electroless plating or the like to form interlayer connection. In order to improve disadvantages of the prior art processes and to provide a high-density wiring board suitable for small-scale production, there are proposed wiring boards obtained by forming an adhesive layer on an insulating substrate and holding insulated wires on the adhesive layer (hereinafter referred to as "wired circuit board") in, for example, U.S. Pat. Nos. 3,674,914 and 3,674,602. The wired circuit boards are produced, as disclosed in these U.S. Patents, by laminating or coating a thermosetting adhesive which is thermoplastic at the time of wiring (by providing wires on the adhesive and at the same time tacking thereto) on an insulating substrate made from thermosetting resin laminates or the like, wiring insulated wires coated with a heat resistant resin such as polyimide resin, or the like by using a numerical control wiring machine, fixing the wired wires by pressing or the like, perforating through-holes at the ends of wires while crossing the wires, exposing cut ends of wires to inner walls of the through-holes and forming a metallic layer at the inner walls of the through-holes by electroless plating to connect cut ends of the wires. According to the thus produced wired circuit boards, since insulated coated wires are used, insulating properties of the wires are high even if the wires are crossed or wired closely in parallel and are thus suitable for high-density wiring.

However, the wired circuit boards have a problem of cross-talk noise between insulated wires closely positioned in parallel when 3 or more wires are provided in a pitch of 2.54 mm between through-holes to make the pitch between insulated wires 0.3 mm or less. Therefore, in the case of a circuit used for high-speed signals, there is a limit for wiring two insulated wires between a pitch of 2.54 mm between through-holes. Such a circuit is insufficient in wiring capacity required for smaller sized devices and has a high production cost due to an increase in the required number of wiring layers.

SUMMARY OF THE INVENTION

It is an object of this invention to provide a high-density wired circuit board reducing cross-talk and having a low production cost while overcoming the disadvantages of the prior art technique.

This invention provides a high-density wired circuit board having a required wiring pattern using insulated wires obtained by forming an adhesive coating layer on an insulating substrate, forming a wiring pattern by spreading insulated wires on the adhesive coating layer and at the same time tacking them thereto, perforating through-holes crossing the insulated wires, and metallizing inner walls of the through-holes, characterized in that the through-holes are perforated at the position of a main grid and at the position of an auxiliary grid situated at the position of a centroid of the main grid, and the insulated wires are wired in the direction parallel to the main grid, that is X and Y directions, and in the direction shifted at an angle of 45° from the main grid.

DESCRIPTION OF THE PREFERRED EMBODIMENTS

According to the latest wiring machine, it is possible to wire three wires in a distance of 50 mil.

Figure 1:
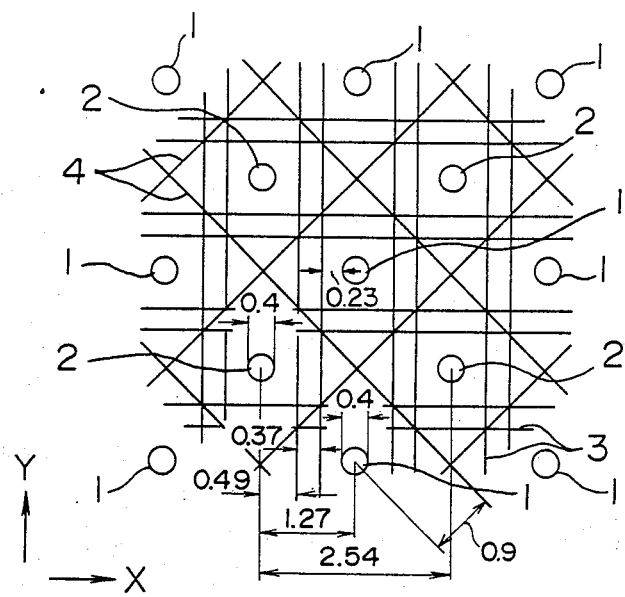
FIGS. 1 and 3 are plane views of wired circuit boards of this invention.
Figure 2:
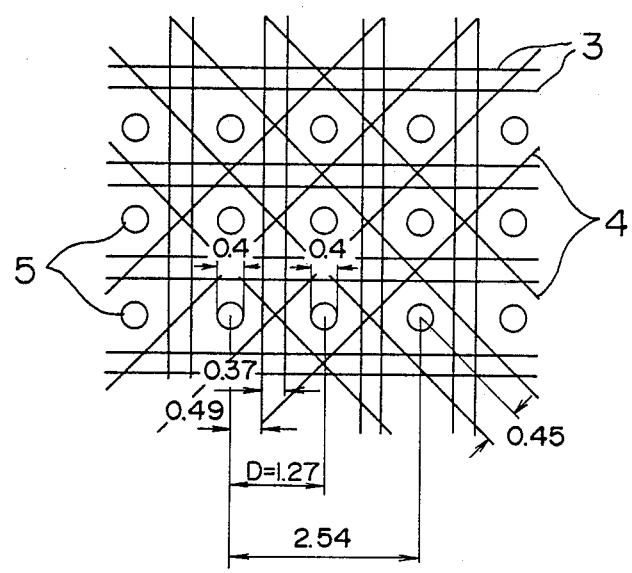
FIG. 2 is a plane view of a prior art wired circuit board.

Since it is a very rare case to require all the 50-mil grid, (the distance between the center of the through-holes in the X and Y direction) an auxiliary grid is situated at the position of the centroid of a main grid of a 100-mil grid (the distance between the center of the through-holes in the X or Y direction) as shown in FIG. 1 according to this invention. Specifically, to the 100-mil grid, an additional 100-mil grid (an auxiliary grid) is added at the position shifted in parallel and at a right angle direction from the former 100-mil grid. Numeral 1 denotes through-holes perforated at the position of the main grid. Numeral 2 denotes through-holes perforated at the position of the auxiliary grid. In these positioned through-holes, 2 wires can be passed in a distance of 50 mil (D=1.27 mm as shown in FIG. 1) to provide the XY direction wiring 3 and it is possible to have a further wiring grid 4 in the direction shifted at an angle of 45° from the X and Y directions. In this case, when the diameter of a through-hole is 0.4 mm and the wire diameter 0.1 mm as shown in FIG. 1, the wiring pitch (the distance between the adjacent parallel insulated wires from center to center) becomes 0.3 mm, the distance between an inclined wire and a through-hole becomes 0.9 mm, and each space between a wire and a through-hole becomes 0.23 mm. In contrast, when two XY direction wiring grids 3 are provided between through-holes and one wiring 4 is provided in the 45° inclined direction in a 50-mil grid as shown in the prior art FIG. 2, each space between an inclined wire and a through-hole becomes 0.45 mm, and each space between a wire and a through-hole becomes 0.2 mm, provided that the through-hole diameter is 1.4 mm, the wire diameter is 0.1 mm and the wiring pitch is 0.3 mm. As is clear from the above explanations, when the auxiliary grid is used as shown in FIG. 1 according to this invention, the space between the wire and the through-hole can be increased without narrowing the wiring pitch which decreased the influence on cross-talk.

Figure 3:
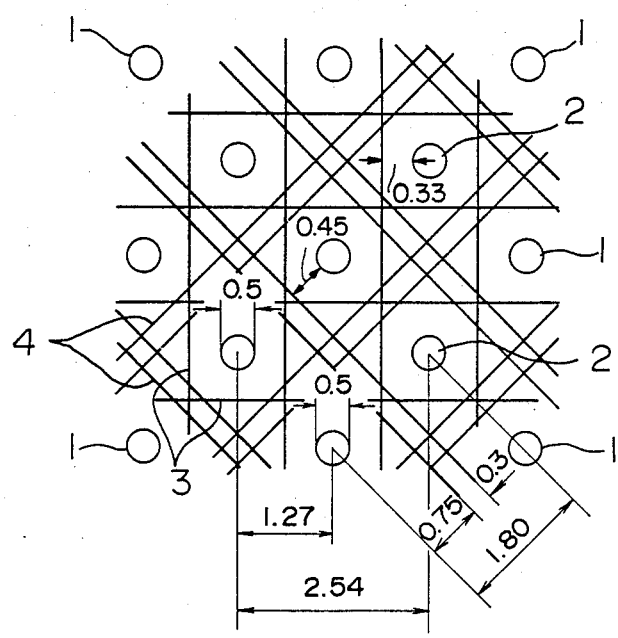
Figure 4:
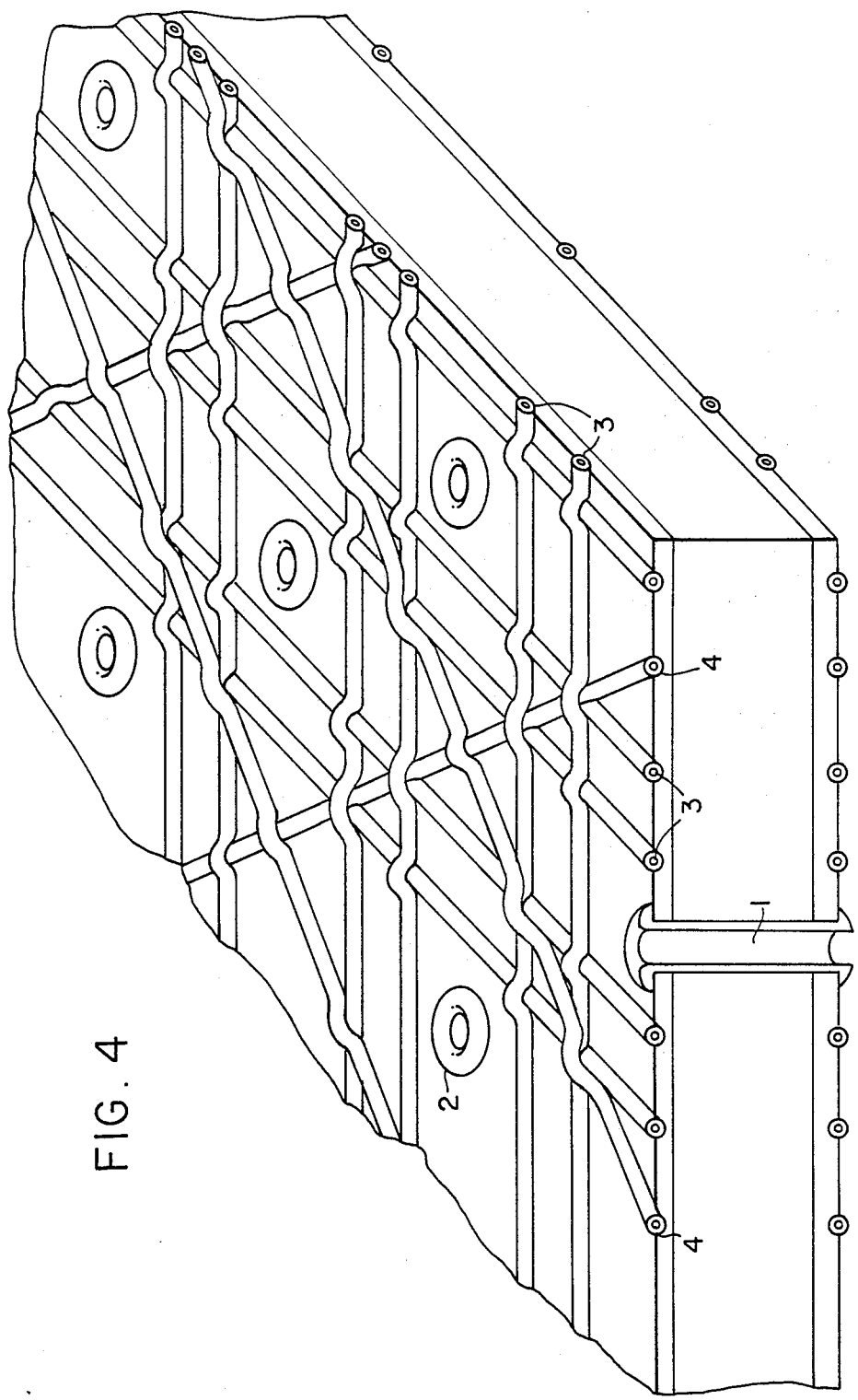
FIGS. 4-6 are dimensional views of the circuits shown in FIGS. 1-3, respectfully, which show the circuit boards, wiring grids and through-holes.
Figure 5:
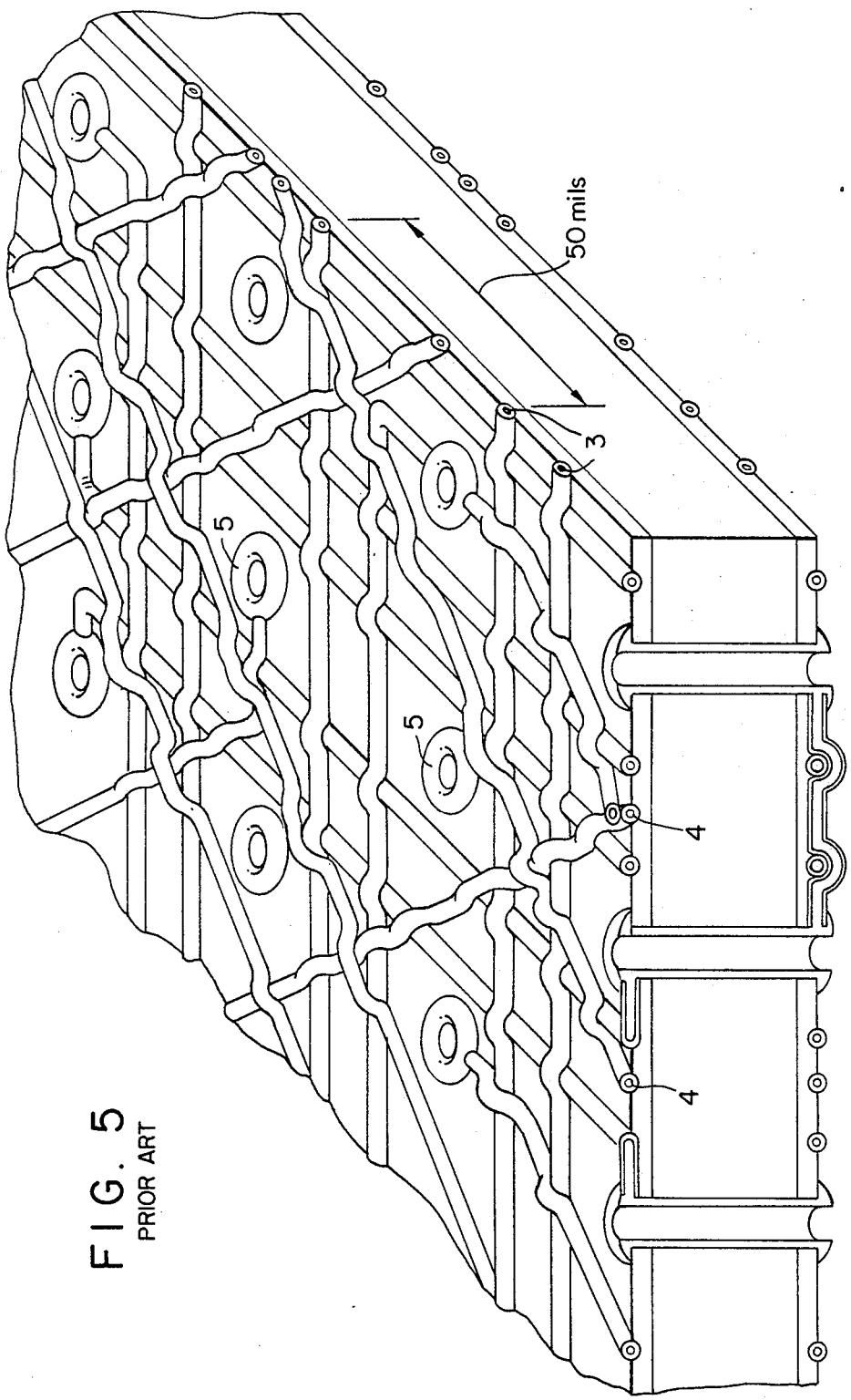
Figure 6:
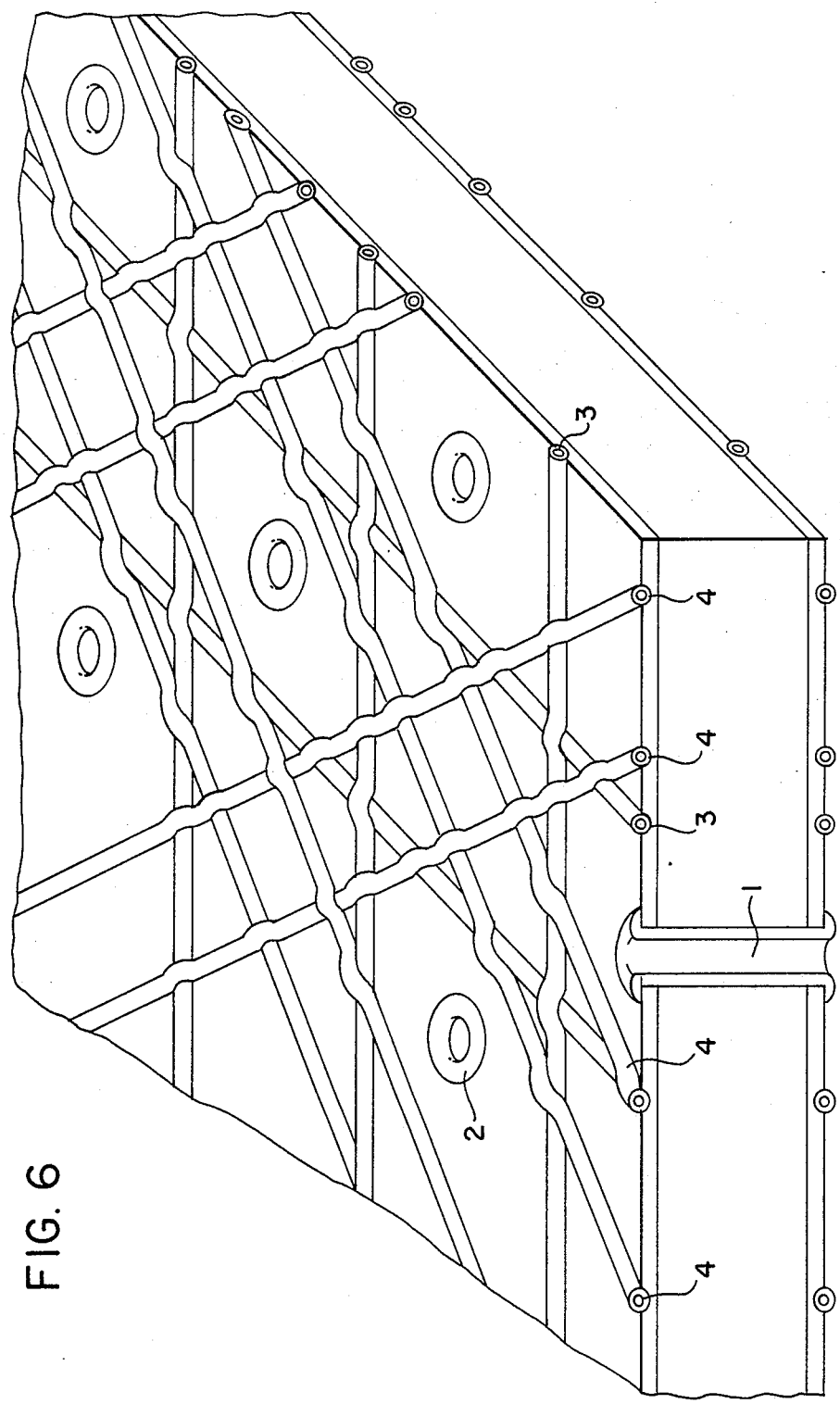
Figure 7:
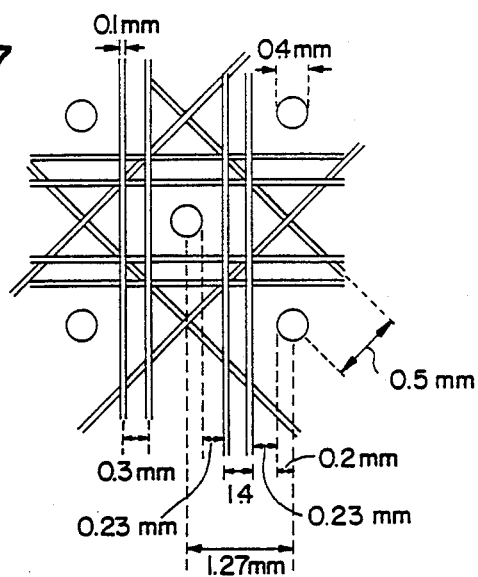
FIGS. 7 and 8 show specific dimensions of the wiring grids on the substrate.
Figure 8:
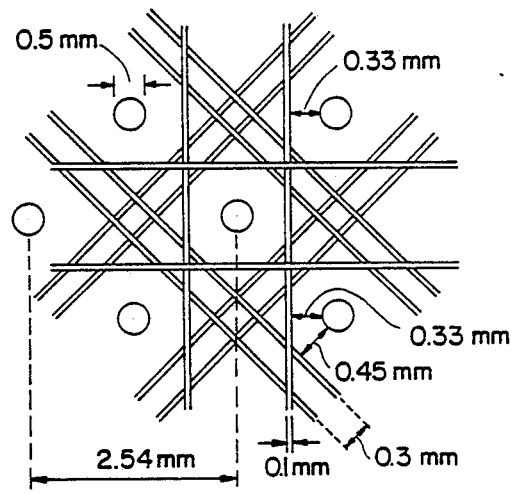

FIG. 3 shows another example of this invention wherein one XY direction wiring grid 3 is provided in a distance of 50 mil and two wiring grid 4 are provided in the 45° inclined direction regarding the XY directions. The space can be 0.33 mm, provided that the through-hole diameter is 0.5 mm, the wire diameter is 0.1 mm and the wiring pitch is 0.3 mm. Further, according to this wiring scheme, a triple crossing point can be avoided.

As mentioned above, the space between the wire and the through-hole can be increased without narrowing the wiring pitch which decreases cross-talk by providing the auxiliary grid at the position of a centroid of the main grid. Further, since the allowance of the hole location precision can be made large, it is possible to maintain good interlayer resistration even in the case of a large size substrate with multi-layer wiring.

What is claimed is:

1. A high-density wired circuit board comprising:
   an adhesive coating layer formed on an insulating substrate;
   a first wiring grid of insulated conductors formed on said insulating substrate in X-Y directions;
   a second wiring grid of insulated conductors formed on said insulating substrate in said X-Y directions, and being spaced apart from said first wiring grid;
   a third wiring grid of insulated conductors formed on said insulating substrate at an angle of 45° with said first and second wiring grids;
   a plurality of through-holes being disposed in said insulating substrate at positions corresponding to centroids of said first wiring grid, such that the distance between adjacent through-holes in each of said X and Y directions is 100 mils.

2. A wired circuit board according to claim 1, wherein said through-holes include metallized inner walls so as to connect wiring grids on both sides of said substrate.

3. A wired circuit board according to claim 1, wherein the diameter of each through-hole is at least 0.4 mm.

4. A wired circuit board according to claim 3, wherein the distance between adjacent parallel wires of said first and second wiring grids is 0.3 mm.

5. A wired circuit board according to claim 3, wherein the shortest distance between the center of a through-hole and on adjacent wire corresponding to said third wiring grid is 0.9 mm.

6. A wired circuit board according to claim 3, wherein the shortest distance between an outer edge of a through-hole and an adjacent wire in the X and Y directions is 0.23 mm.

7. A wired circuit board according to claim 6, wherein the diameter of each through-hole is 0.5 mm.

8. A wired circuit board according to claim 7, wherein the distance between adjacent parallel wires of said first and second wiring grids is 0.3 mm.

9. A wired circuit board according to claim 7, wherein the shortest distance between an outer edge of a through-hole and an adjacent wire of said third wiring grid is 0.33 mm.

10. A wired circuit board according to claim 7, wherein the shortest distance between an outer edge of a through-hole and a wire of said first and second wiring grid in said X or Y direction is 0.45 mm.

11. A process for producing a high density wired circuit board using insulated wires, comprising the steps of:
    forming a adhesive coating layer of an insulating substrate;
    forming a first wiring grid of insulated conductors on said insulating substrate in X-Y directions;
    forming a second wiring grid of insulated conductors on said insulating substrate in said X-Y directions and spaced apart from said first wiring grid;
    forming a third wiring grid of insulated conductors on said insulating substrate at an angle of 45° with said first and second wiring grids;
    forming a plurality of through-holes in said insulating substrate at positions corresponding to centroids of said first wiring grid, such that the distance between adjacent through-holes in each of said X and Y directions is 100 mils.

12. A process according to claim 11, further comprising the steps of:
    forming a metalized inner wall in said through-holes so as to connect wiring grids on both sides of said insulating substrate.

13. A process according to claim 11, wherein the diameter of each through-hole is formed to be 0.4 mm.

14. A process according to claim 13, wherein the distance between adjacent parallel wires of said first and second wiring grids is formed to be 0.3 mm.

15. A process according to claim 13, wherein the shortest distance formed between the center of a through-hole and an adjacent wire corresponding to said third wiring grid is 0.9 mm.

16. A process according to claim 13, wherein the shortest distance formed between an outer edge of a through-hole and an adjacent wire in the X and Y directions is 0.23 mm.

17. A process according to claim 12, wherein the diameter of each through-hole is formed to be 0.5 mm.

18. A process according to claim 17, wherein the distance formed between adjacent parallel wires of said first and second wiring grids is 0.3 mm.

19. A process according to claim 17, wherein the shortest distance formed between an outer edge of a through-hole and an adjacent wire of said third wiring grid is 0.33 mm.

20. A process according to claim 17, wherein the shortest distance formed between an outer edge of a through-hole and a wire of said first or second wiring grid in said X or Y direction is 0.45 mm.

* * * * *